United States Patent
Hau et al.

(10) Patent No.: US 7,479,827 B2
(45) Date of Patent: Jan. 20, 2009

(54) MULTI-MODE POWER AMPLIFIER WITH HIGH EFFICIENCY UNDER BACKOFF OPERATION

(75) Inventors: Gary Hau, Merrimack, NH (US); Abid Hussain, Methuen, MA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/841,162

(22) Filed: Aug. 20, 2007

(65) Prior Publication Data

US 2008/0030276 A1   Feb. 7, 2008

Related U.S. Application Data

(63) Continuation-in-part of application No. 11/385,948, filed on Mar. 21, 2006.

(51) Int. Cl.
 *H03F 1/14* (2006.01)
(52) U.S. Cl. .................. 330/51; 330/151; 330/302; 330/310
(58) Field of Classification Search .......... 330/51, 330/133, 151, 302, 310
See application file for complete search history.

(56) References Cited

U.S. PATENT DOCUMENTS

| | | | | |
|---|---|---|---|---|
| 5,661,434 | A * | 8/1997 | Brozovich et al. | 330/51 |
| 6,208,203 | B1 * | 3/2001 | Jung et al. | 330/51 |
| 6,522,195 | B2 * | 2/2003 | Watanabe et al. | 330/51 |
| 6,900,692 | B2 * | 5/2005 | Kim et al. | 330/51 |

* cited by examiner

*Primary Examiner*—Khanh V Nguyen
(74) *Attorney, Agent, or Firm*—Cesari and McKenna, LLP; Edwin H. Paul, Esq.

(57) ABSTRACT

A multi-mode RF amplifier is disclosed having high and low output power modes and two power paths. A first RF amplifier delivers power to both paths. When the multi-mode RF amplifier is biased into the high power, HP, mode, substantial power is delivered via both (first and second) paths. While in the low power, LP, mode, an RF switch is turned off, creating a high input impedance, open circuit for the first path, and effectively isolating the two paths. Therefore, power is delivered by the first RF amplifier to the second path only. The impedance presented to the output of the first RF amplifier is equal to the input impedance of the second path which may be optimally set for maximizing power added efficiency or output power in LP mode. Note that, in a preferred embodiment, even in the HP mode more power is delivered to the second power path than to the first power path.

17 Claims, 6 Drawing Sheets

| | LP | HP | |
|---|---|---|---|
| 12 | $Z_{intL} \ll Z_{intH}$ | $Z_{intL} \gg Z_{intH}$ | 10 |
| 20 | $P_L \gg P_H$ | $P_L \ll P_H$ | 22 |
| 18 | $Z_{PA}(LP)$ | $\gg \quad Z_{PA}(HP)$ | |
| 14 | $Z_{intH}(LP)$ | $\gg \quad Z_{intH}(HP)$ | |
| 16 | $Z_{intL}(LP)$ | $\ll \quad Z_{intL}(HP)$ | |

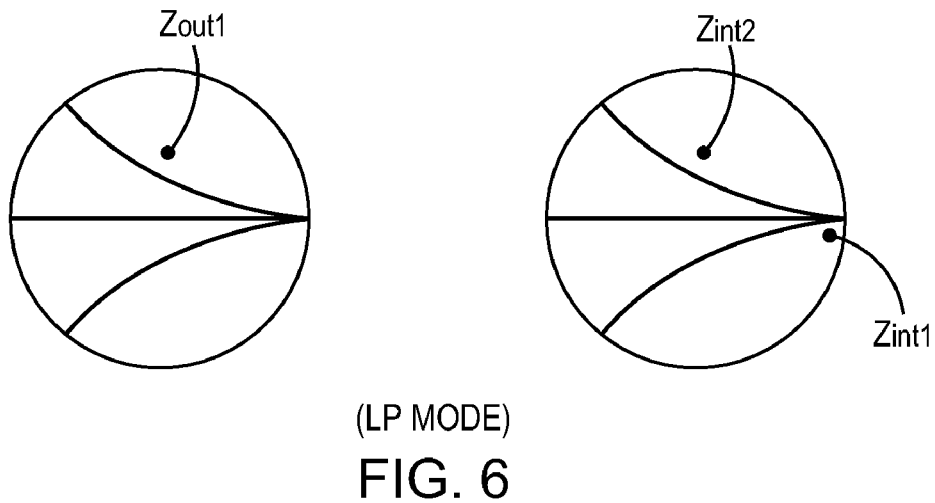
(LP MODE)
FIG. 6
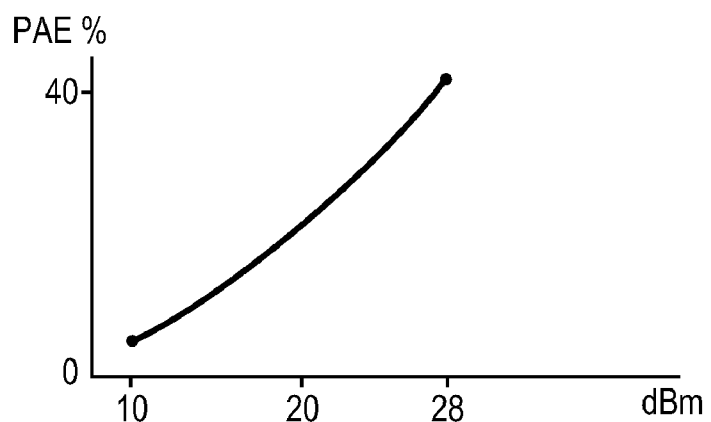
FIG. 7 (HP MODE)
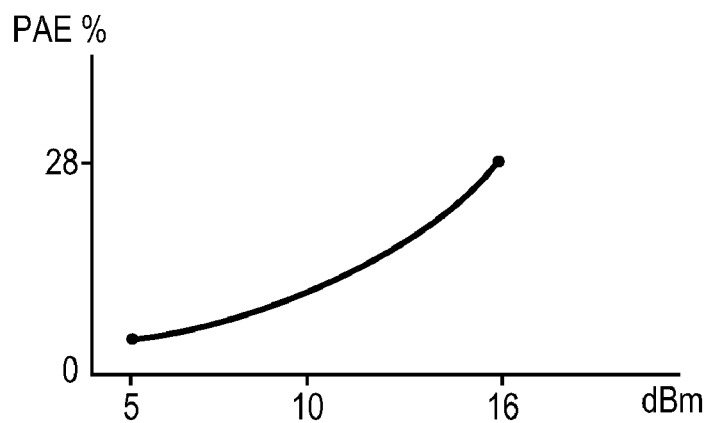
FIG. 8 (LP MODE)

MULTI-MODE POWER AMPLIFIER WITH HIGH EFFICIENCY UNDER BACKOFF OPERATION

CROSS REFERENCE TO RELATED PATENTS

The present application is related to the commonly owned U.S. patent applications: a) Ser. No. 11/350,220, filed Feb. 8, 2006, and entitled: "Power Amplifier with Close-Loop Adaptive Voltage Supply," by G. Hau et al.; and is a continuation-in-part of b) Ser. No. 11/385,948, filed Mar. 21, 2006, and entitled "Multi-Mode Power Amplifier with Reduced Low Power Current Consumption," by G. Hau.

The above applications are hereby incorporated herein by reference.

BACKGROUND OF THE INVENTION

1. Field of the Invention

The present invention relates to power amplifiers and, more particularly, to power amplifiers used in battery powered mobile handsets, and even more particularly to optimizing battery current use in such power amplifiers over a range of output power levels.

2. Background Information

Radio-frequency (RF) signals generated at a mobile handset generally are amplified, transmitted through the handset antenna and sent to a base station for distribution to receivers. Often the frequency bands of operation of the handsets are predetermined, mainly in the frequency range from 800 MHz to 2000 MHz for various mobile standards such as WCDMA (wide band code division multiple access) and CDMA (code division multiple access). The present invention, however, may find advantageous use in device operating at other frequencies and with other formats.

In general, the handset is required to transmit at a high output power level when it is farther away from a receiving base station in order to maintain a pre-determined signal strength at the base station for sufficient reception. Conversely, the closer the handset to the base station, less transmitted power would be required. The handset output power is adjusted according to the command embedded within the RF control signal transmitted from the base station to the handset.

The handset transmitted signal, and hence the RF power amplifier output signal, has to meet the FCC regulation on spectral re-growth (also known as linearity—often measured in terms of adjacent channel leakage power ratio (ACLR) which stipulates the maximum allowable interference to other frequency channels in order to minimize interference between signals). Some known mobile devices (handsets) have RF power amplifiers powered by the full battery voltage at all times. The RF power amplifies are generally designed to meet the linearity specification at maximum transmit power level (+28 dBm for WCDMA system) under such a bias condition. Statistically, power amplifiers transmits at maximum linear output power only for a small fraction of time, while most of the transmissions take place at a considerably lower power levels (10-20 dB below maximum power). The power added efficiency (PAE, a metric known in the art) of the power amplifiers usually drops off rapidly at backoff or LP ("Low Power" and "back off" are synonymous) levels, resulting in non-optimal current consumption coupled with excessive linearity margin. As known to those skilled in the art, the excessive linearity margin can be a trade-off for lower current consumption in the design of power amplifiers.

The actual output power level from the power amplifier (and hence the handset), is continuous from some −50 dBm to 28 dBm. High Power (HP) and Low Power (LP) modes are known in the art as part of the PA functions. The HP generally applies to the range from 16 dBm to 28 dBm, and LP to power levels below 16 dBm. Use of HP and LP modes further improves efficiency in the low power range as compared to a conventional PA.

The above cross referenced application a) describes power amplifiers that provide a reasonably continuous measurement of output power required from a predetermined optimum relationship, that is defined therein. Also defined in this earlier application is the linearity relationship and adjacent channel interference as determined by the FCC. This earlier application provides the required optimum current consumption at each output power by varying the bias power supply to the power amplifiers. These relationships are well described in the prior art, the incorporated applications and the U.S. patent Kim discussed below. Thus, later references to these relationships are made without detail.

U.S. Pat. No. 6,900,692 B2 to J. Kim et al., (Kim) discloses a system that optimizes the current consumption of the power amplifier at two discrete power output levels, i.e. the maximum output power at LP and HP modes operation. This patent is incorporated herein by reference. Kim describes earlier art, with respect to its invention, that incorporates switches (electronic and/or actual mechanical switches with pole pieces) into the power amplifier design where two different parallel signal paths are utilized, one for the LP and one for the HP mode. However, any such switches are lossy, costly, several must be used to provide bypassing, and complex control may be required. Increased power loss and current consumption and large physical size all limit the applications of such circuits in handset power amplifiers.

Kim's advance over the described prior art provides a two path power amplifier with a low power (LP) and a high power (HP) mode without switches. In the low power mode the high power path is disabled and a bypass circuit carries the low power to the output. Kim describes a circuit that reduces power consumption (and therefore extends battery life) in the low power mode and provides higher PAE (power added efficiency). PAE is a metric term known to those skilled in the art. Kim provides parallel impedance matching/transforming circuits that define two paths to the RFout, one for HP and one for LP operation. Kim's inventive circuitry (See Kim's FIGS. 5 and 6) is reproduced herein as FIG. 1. When high power is required, the Voltage Control 2 will provide a control signal to turn on the PA for signal amplification. When in the low power mode, the Voltage Control 2 will provide a control signal to turn off the PA. Kim's FIG. 8 illustrates a voltage control circuit that provides the on/off control to Kim's driver and power stage.

FIG. 2 details the impedances and power delivered by Kim in the HP and LP modes. In the HP mode, the PA is active and Kim provides an impedance ZintL that is significantly higher 10 than ZintH, so that the power, PH, delivered to the $2^{nd}$ impedance matching circuit is much higher 22 than the power, PL, delivered to the Ztrans, an impedance transformer. The PA amplifies the signal and provides, via the $3^{rd}$ and $4^{th}$ impedance matching circuits, a high power RF out. In the LP mode the opposite occurs, the PA is biased off, and ZintH is significantly higher 12 than ZintL, and PL is much higher 20 than PH. Kim details that the "significantly higher" impedance level means two times (or more) larger.

So Kim discloses and requires the relationships as shown in FIG. 2. That is: a) when in LP mode, ZintL is much lower 12 than ZintH; b) when in HP mode, ZintL is much higher 10 than ZintH; and c) ZintH in LP mode is much higher 14 than ZintH in HP mode, d) ZintL in LP mode is much lower 16 than ZintL in HP mode; and e) ZPA, the input impedance of the PA, in LP mode is much higher 18 than ZPA in HP mode. As evidenced in FIG. 1, Kim, via the voltage control 2, controls the on/off characteristics of the PA depending on the mode of operation. In doing so the impedance characteristics of ZintH and ZintL change due to the change in the input and output impedance level of the PA. So in the HP mode, the PA is biased on and ZintH impedance is much lower than ZintL and most power travels through the PA. In the LP mode, the input and output impedances of the PA change when it is turned off, which increases ZintH and decreases ZintL so that more power travels through Ztrans. Moreover, the change in output impedance of the PA in the LP mode affects the $3^{rd}$, $4^{th}$ and Ztrans impedance. These impedance networks are designed to minimize the power leakage through the $3^{rd}$ matching circuit to the PA. Implementing these techniques are known to those skilled in the art.

Limitations in Kim can be found directly from FIG. 1. For example, Kim's five impedance matching circuits are complex and several simultaneous matching requirements under HP and LP modes would require tradeoffs in performances. In Kim's HP mode operation, Ztrans is designed in conjunction with the $3^{rd}$ and $4^{th}$ impedance networks to increase ZintL. While under LP mode operation, these three impedance matching networks are required to reduce ZintL. If the matching networks are optimized for the best ZintL under LP mode operation, it might not be optimal under HP mode operation which would increase undesired leakage power through Ztrans and degrade HP mode performance. On the other hand, if the matching networks are optimized for the best ZintL under HP mode operation, then ZintL might not be optimal under LP mode operation which could increase the current consumption of the driver stage.

Moreover, Kim describes his power amplifier system where, in the HP mode, the power leakage into Ztrans is minimized, and most of the power from the driver stage will be amplified by the PA. This operation is similar to the conventional power amplifiers where the final stage delivers the output power and consumes majority of the current, and therefore operates at a much higher thermal temperature than the driver stage.

FIG. 3 illustrates typical PAE of a power amplifier operating in a single power mode. It is evident that in the back-off or low power range, PAE is very low. FIG. 4 shows operation of a system with two power level modes, as in Kim and as might be used with the present invention. Here it is clear that PAE is improved in the LP mode.

Reiterating the limitation of the prior art, referencing FIG. 1, the power amplifier, PA, is supposed to be in the off state in the LP mode operation. However, the PA will start to turn on when there is a significant RF power level presented at the PA's input. Conduction of the PA in the LP mode will significantly degrade the linearity (ACLR level) of the output signal due to phase mismatch of signals from the two paths when they are combined at the input of the output matching, $4^{th}$ Z matching, network. This limits the maximum linear output power capability under LP mode operation. In addition, the impedance presented by the Ztrans matching network to the $1^{st}$ Z matching network cannot be selected optimally to maximize LP mode efficiency as a result of limited isolation between the two passive matching networks, $2^{nd}$ Z matching and Ztrans. Ztrans is tradeoff between efficiency and minimizing power leakage to the interstage $2^{nd}$ Z matching network under LP mode operation. Typical LP mode efficiency as 16 dBm output power is about 19%.

The prior art, generally, remains power inefficient due to potential tradeoffs required for matching impedances for HP and LP modes, and the prior art also employs complex circuitry.

SUMMARY OF THE INVENTION

The present invention provides a multi-mode RF power amplifier that addresses limitations in the prior art and provides advantages with respect to the prior art. In one embodiment, the inventive multi-mode amplifier includes two paths both suitable for delivering RF power to an output. A first path includes, in order, an input impedance matching network, a first or main power amplifier, an RF switch, a first impedance matching network, a second or auxiliary power amplifier and a second impedance matching network coupled to an output delivering RF power. The second path includes, in order, the input impedance matching network, the first power amplifier, a bypass impedance matching network, and the second impedance matching network. The bypass impedance matching network is connected in parallel with the RF switch, the first impedance matching network and the second power amplifier.

In an embodiment, the multi-mode RF power amplifier assumes at least two operating modes, the first being the HP (higher power) output mode and the second mode being the LP (lower power) output mode. In the HP mode power travels through both paths as described above. In the LP mode, the RF switch is turned off so power travels only through the bypass impedance matching network. In the HP mode, the RF switch is turned on which presents a short circuit with negligible loss, and the input impedance of the first and the bypass impedance matching circuits are about equal, so that power delivered from the first power amplifier is about equally delivered to both the first and bypass impedance matching circuits. However, in other illustrative embodiments, the power delivered to the bypass circuit is larger than that delivered through the RF switch. The result is that substantial power travels through both paths and both contribute to the final HP output.

Since the power delivered in the HP mode is shared between the two paths, it becomes unnecessary to minimize any power leakage to the bypass impedance matching circuit as described in Kim. The advantages of this operation are: in the LP mode, that the RF switch is turned off to prevent any power leakage to the auxiliary amplifier; increased isolation between the first and the second paths, and this increased isolation allows optimally chosen impedance for the bypass impedance matching network in the second (LP) path presented to the output of the main amplifier. These advantages allow the multi-mode RF power amplifiers to operate with higher efficiency and/or higher output power capability in LP mode operation.

In an example illustrating the invention, when the multi-mode RF power amplifier is in the LP mode, the RF switch is turned off isolating the first and second paths, and power only travels through the LP or second path to the output.

The multi-mode RF power amplifier is placed, in a preferred embodiment, in one or the other mode by turning the RF switch on (HP mode) or off (LP mode).

The multi-mode RF power amplifier when in the HP mode, in an illustrative embodiment, the input impedance of the first matching network may be greater than the input impedance of the bypass impedance matching network.

The present invention provides an RF power amplifier with reduced current consumption under back off power operations. A bias network control the DC bias current, the on/off characteristics of the main and auxiliary power amplifiers and an RF switch.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 6 is a simplified Smith Chart of some relative impedances in the LP mode;
FIG. 7 is a chart of PAE (power added efficiency) in HP mode versus output power levels;
FIG. 8 is a chart of PAE (power added efficiency) in LP mode versus output power levels.

DETAILED DESCRIPTION OF AN ILLUSTRATIVE EMBODIMENT

Figures 1, 2:
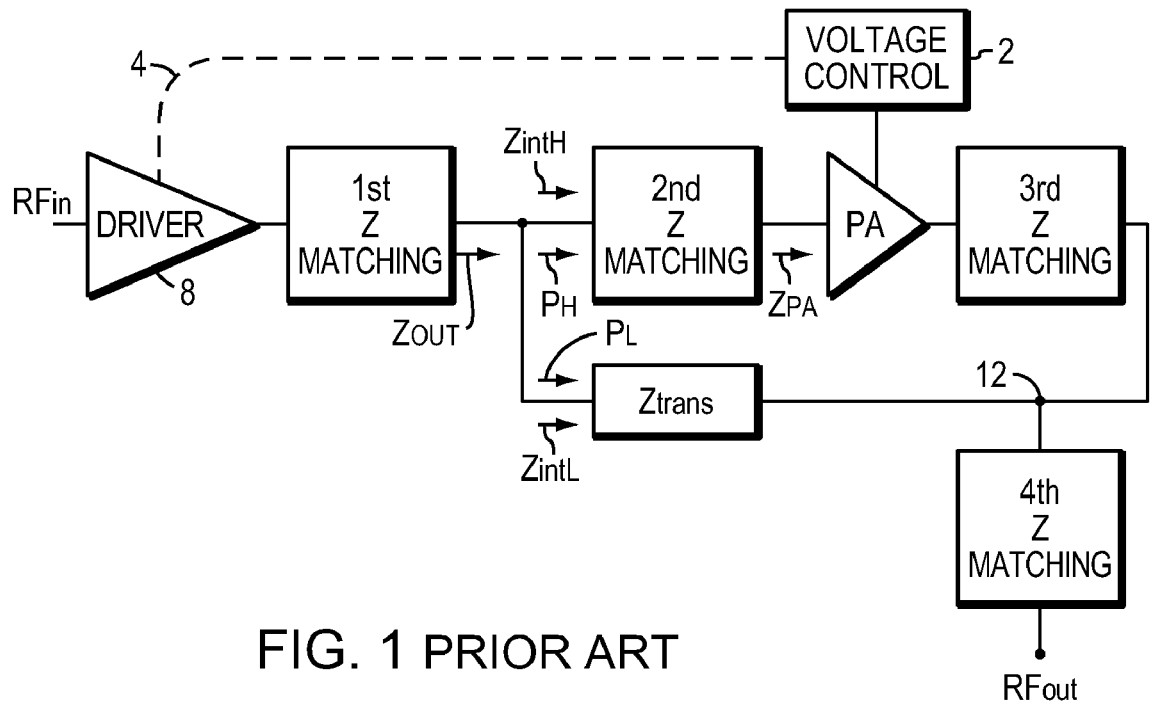
FIG. 1 is a prior art (Kim) circuit block diagram.
FIG. 2 shows relationships required in the circuit of FIG. 1.
Figure 3:
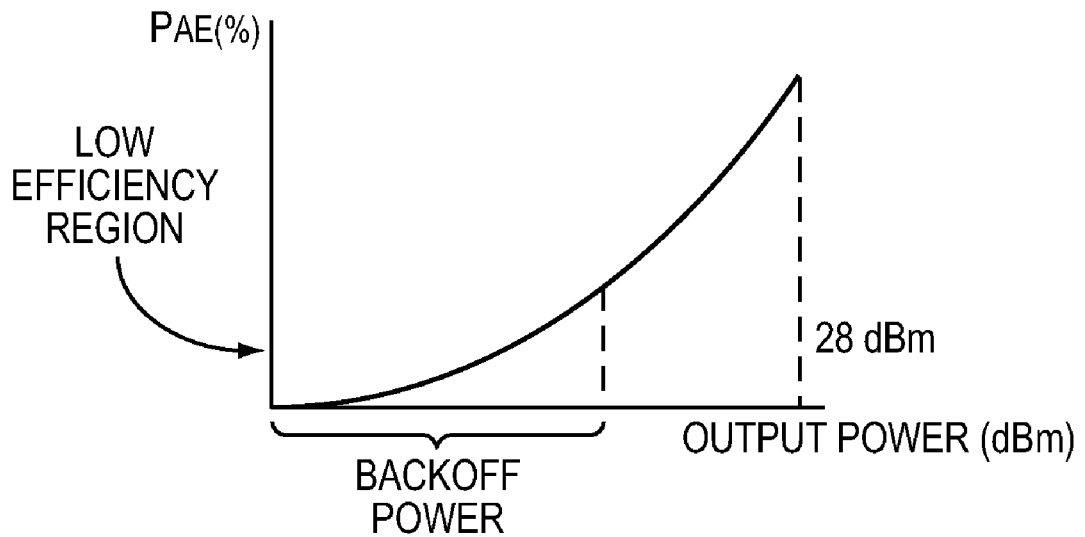
FIG. 3 is a trace illustrating efficiency of a power amplifier in the prior art utilizing a single power level mode.
Figure 4:
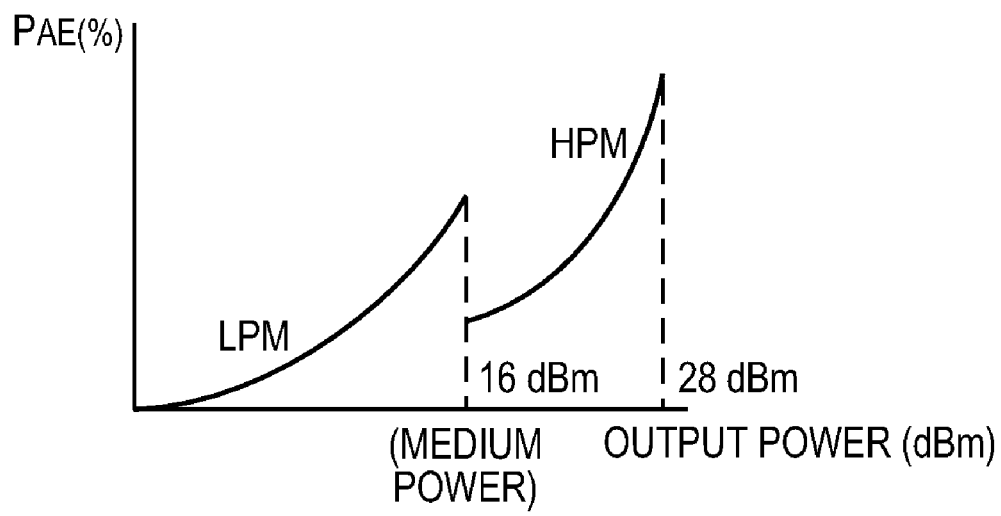
FIG. 4 is a trace illustrating desired efficiency of a power amplifier in the prior art utilizing two power level modes.
Figure 5:
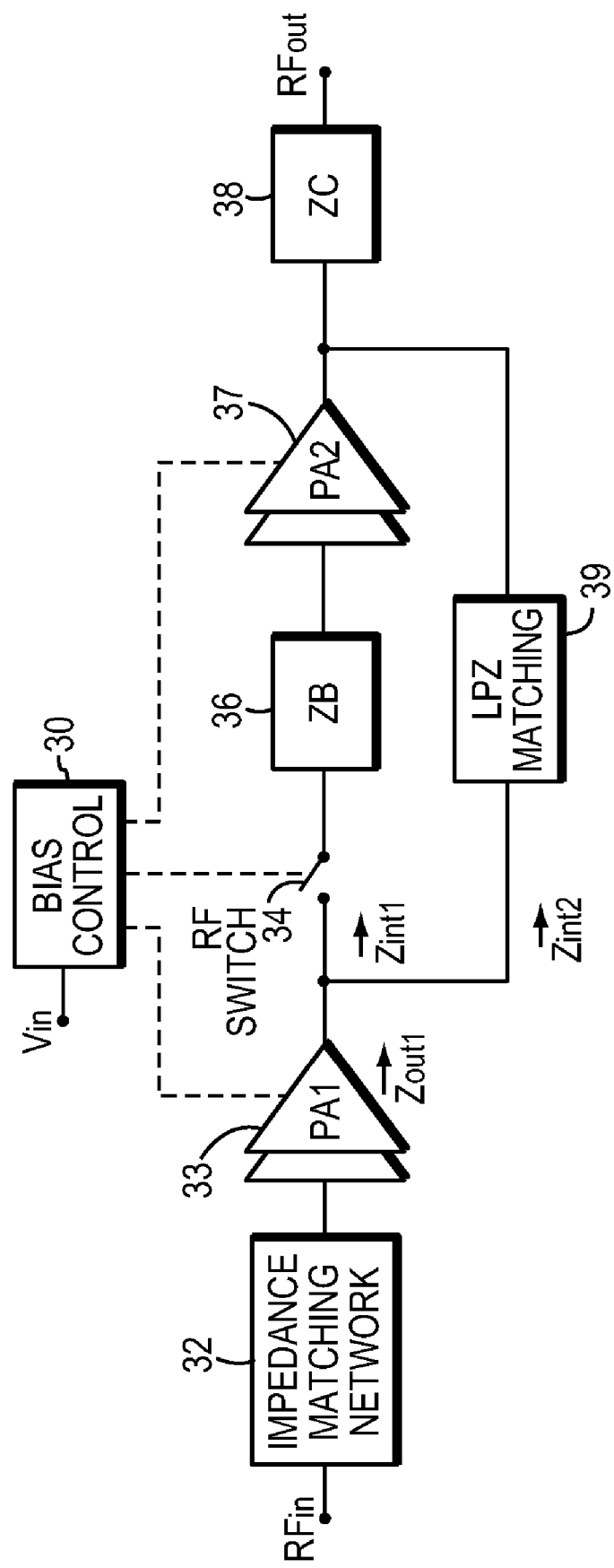
FIG. 5 is a circuit block diagram illustrating the present invention.

FIG. 5 illustrates a block diagram circuit incorporating an embodiment of the pre-sent invention. Comparing FIG. 5 with FIG. 1, two impedance matching circuits, the $1^{st}$ and the $3^{rd}$ in FIG. 1 are eliminated in FIG. 5. In FIG. 5 there are two power paths, the first being from the input matching network 32 to a first multi-stage power amplifier 33, an RF switch 34, an inter-stage impedance matching network ZB 36, and a multi-stage auxiliary PA (power amplifier) 37 to an output impedance matching network Zc 38. The second path is from the input matching network 32 to the multi-stage power amplifier 33, a LPZ matching network 39 to the output impedance matching network Zc 38.

"First path" describes the path through the RF switch 34 in the HP mode, while the "second path" describes the path through the LPZ matching network 39. This second path is always operational. These designations are used to prevent confusion with HP and LP modes.

The bias control 30 in response to Vm, a power mode control signal, sets the bias currents of both PA1 and PA2, and to turn on and off the RF switch 34.

With respect to FIG. 5, addresses concerns of the prior art and the above incorporated Fairchild owned patent applications by inserting the RF switch 34 before the interstage impedance matching network ZB 36.

FIG. 5 illustrates the operation in the low power mode where the RF switch 34 is open providing a high impedance. The open RF switch better isolates the LP second path from the HP first path in the LP mode. In the HP mode the RF switch is closed directly coupling the power amplifier PA1 output to the inter-stage impedance matching network ZB 36. Illustratively, the RF switch may be a FET or a HBT (Heterojunction Bipolar Transistor).

In the HP mode the circuit of FIG. 5 operates as does the equivalent circuit in the above incorporated by reference Fairchild patent application, entitled "Multi-Mode Power Amplifier with Reduced Low Power Current Consumption," Ser. No. 11/385,948, filed Mar. 21, 2007.

FIG. 6 illustrates via Smith Charts the impedance in the LP mode of operation. Zout1, the output impedance of the power amplifier PA1, can be seen to closely match Zint2, the input impedance of the LP second path. The open circuit RF switch presents a very high impedance such that Zint1 does not affect Zint2. So the impedance seen by PA1 is essentially Zint2. This provides the ability for the designers to meet the output power and efficiency required in LP mode operation by optimally choosing Zint2 without the concern of loading effect from Zint1. This design flexibility is not found in earlier designs. In practice the isolation between the two paths amounts to about 15 dB at about an output RF power of 16 dBm, as compared to around 6 dB in prior art.

The open RF switch effectively eliminates power leakage via the fist path. Illustratively, when the RF power out via the LP path reaches as high as 22 dBm, the multi-stage auxiliary power amplifier PA2, does not turn on. This allows the power amplifier to operate in the LP mode at a higher output power level, without turning on the auxiliary PA2, than earlier designs.

The HP mode performance is not affected by the RF switch as illustrated in FIG. 7. Here the PAE exceeds 40% at 28 dBm output power. The placement of the RF switch at a location where the RF power is low effectively eliminates any effect due to the loss of the switch.

FIG. 8 illustrates the LP mode efficiency of the power amplifiers which exceeds 28% at 16 dBm output power. Earlier designs demonstrate about 19% efficiency at similar output power.

Figure 9:
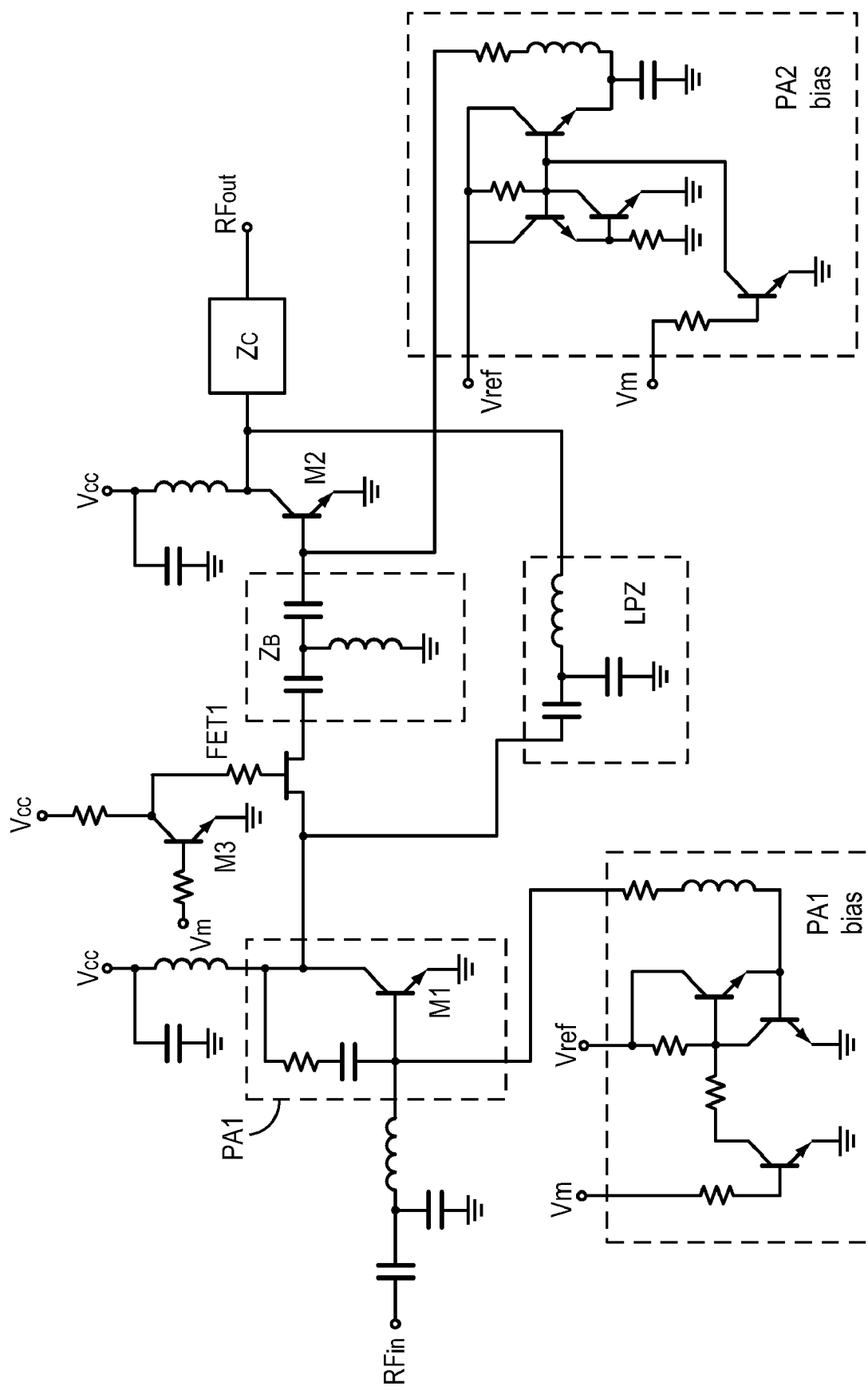
FIG. 9 is a simplified component schematic illustrating the types of circuits useful to implement the present invention.
Figure 10:
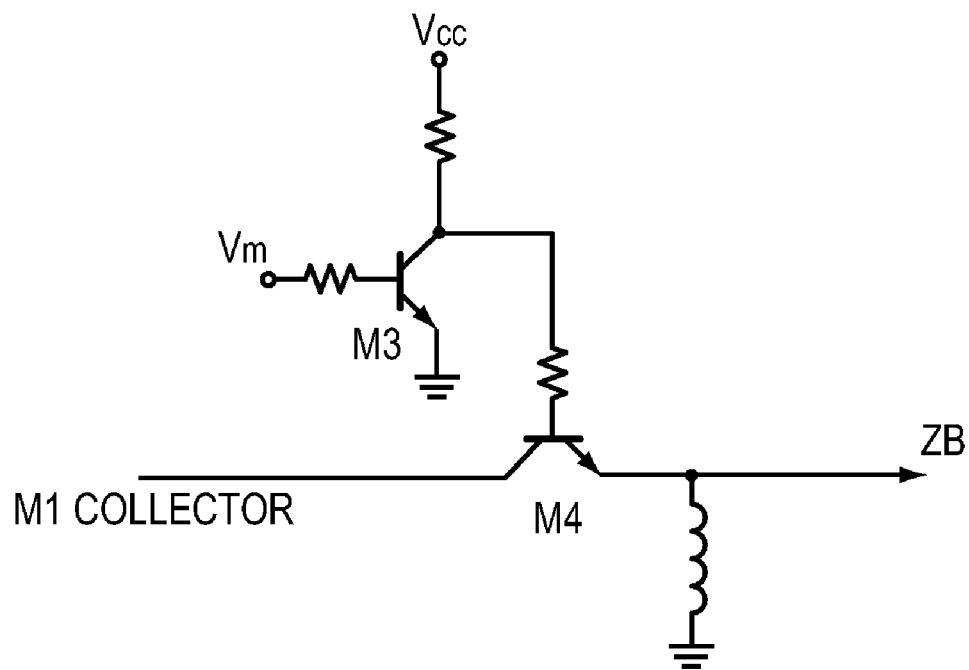
FIG. 10 illustrates an HBT transistor replacement for the FET.
Figure 11:
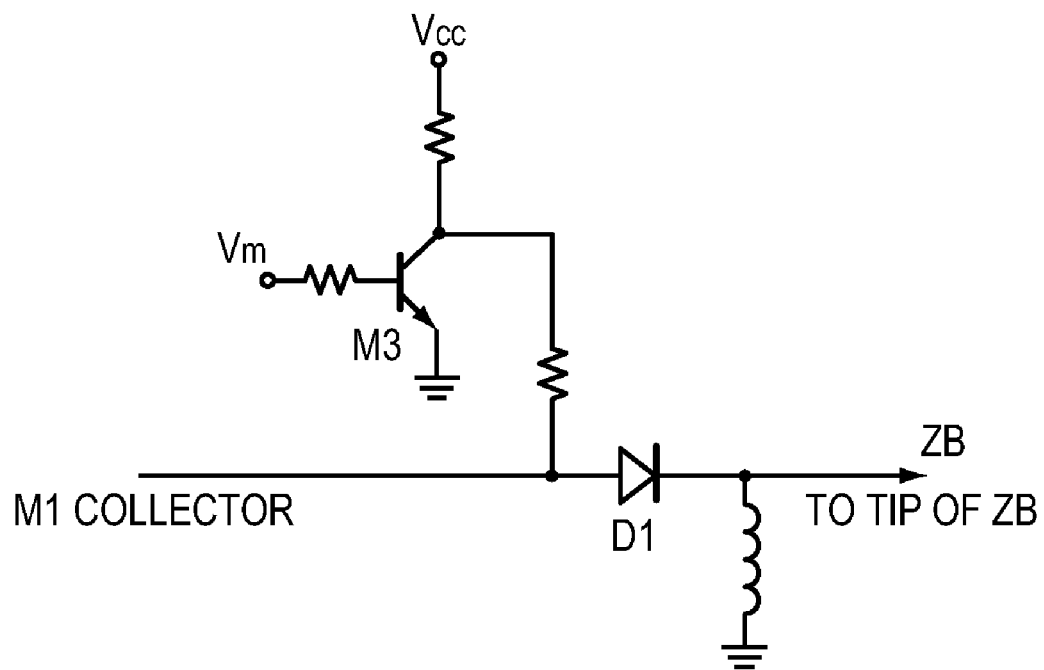
FIG. 11 illustrates a diode for replacement for the FET.

FIG. 9 is a simplified schematic for a circuit implementation of FIG. 5. The bias mirror circuits for PA1 and PA2, LPZ, ZB, and PA1 and PA2 are illustrative. ZC is circuitry that provides the load impedance to the LPZ circuitry and the second power amplifier M2. In operation Vm selects between the HP and LP modes. Vm via PA1 biases the first or main power amplifier M1, the second or auxiliary power amplifier M2 via PA2, and the RF switch FET1 to place the amplifier in the HP or the LP mode. In the LP mode, M3 turns off FET1 and PA2 bias is a mirror bias that is arranged to turn off M2. In the HP mode, M3 turns on FET1 and PA2 turns on M2. PA1 bias is a two Vbe mirror bias that is arranged to reduce the DC bias current for M1 in LP mode as compared to the HP mode. The DC bias current for M1 under LP and HP modes are optimized for best performances in the corresponding mode of operation. Note that the biasing of M2 via the PA2 bias will modify the input and output impedance of M2 and, hence, ZB as well as LPZ. With the addition of RF switch FET1, the effect of any change in ZB on Zout1 is eliminated in LP mode operation. For example, when the mode is changed from the HP to the LP mode, the biasing of M2 is turned off by PA2 bias and FET1 is turned off such that virtually no power is delivered to ZB from M1. Thus, in the LP mode, the impedance of LPZ may be optimized for most efficient operation. FIG. 10 illustrates an HBT replacing the FET1 and FIG. 11 illustrates a diode replacing the FET1. In other applications other switch types and combinations thereof may be used, including bipolar, other types of FET and diodes.

In the embodiments of FIGS. 9, 10 and 11, when Vm is high the low power mode is selected and Vm high selects the low power mode. Vm high turns on NPN M3, which drive the gate of FET 1 low turning off the RF switch, FET1. Similarly, when Vm is high the base of M4 is driven low turning off the RF switch, HBT M4, and Vm high drives the anode of D1 low turning off the RF switch, D1. When Vm is low, the aforementioned RF switches are turned on.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An RF power amplifier comprising:
   a first power amplifier,
   a power mode control,
   an RF switch responsive to the power mode control;
   a first impedance matching circuit,
   a second power amplifier,
   a second impedance matching circuit, wherein a first path comprises the first power amplifier, the RF switch, the first impedance matching circuit, the second power amplifier, and the second impedance matching circuit,
   a bypass impedance matching circuit, wherein a second path comprises the first power amplifier, the bypass impedance matching circuit, and the second impedance matching circuit,
   wherein, when the RF amplifier is in a first mode, the RF switch is closed and power flows through both the first and the second paths to an output, and, when the RF amplifier is in a second mode, the RF switch is open and power flows only through the second path to the output.

2. The RF amplifier of claim 1 wherein when the amplifier is in the first mode, the impedances of the first and of the bypass impedance matching circuits are about equal, thereby about equally dividing the power flowing through each path.

3. The RF amplifier of claim 1 wherein when the RF amplifier is in the second mode, the RF switch is an open circuit and substantially all power is delivered to the bypass impedance matching circuit.

4. The RF amplifier of claim 3 wherein the input impedance of the bypass impedance matching circuit can be designed for power transfer efficiency irrespective of the input impedance of the first path.

5. The RF amplifier of claim 1 wherein the first mode is where a higher power is output from the RF amplifier and the second mode is where a lower power is output from the RF amplifier, and wherein the input impedance of the first matching circuit is greater than the input impedance of the bypass impedance matching circuit in the first mode.

6. The RF amplifier of claim 1 wherein when the RF amplifier is in the second mode the second power amplifier is biased off, and the input impedance of the bypass impedance matching circuit about matches the output impedance of the first power amplifier.

7. The RF amplifier of claim 1 further comprising a bias circuit coupled to the first and the second power amplifier, wherein the bias circuit, in response to a change in modes, changes the impedances of the second power amplifier.

8. The RF amplifier of claim 1 further comprising the bias circuit is also coupled to the first power amplifier, wherein the bias circuit, in response to a change in modes, changes the DC bias current of the first power amplifier.

9. The amplifier of claim 1 wherein the RF switch is selected from the group consisting of an FET, a bipolar transistor, a hybrid bipolar transistor, a diode, or combinations thereof.

10. A method for transferring RF power comprising the steps of:
    outputting RF power from a first amplifier; the first amplifier defining a first output impedance,
    selecting a high power or a low power mode, wherein in the high power mode a first and a parallel second path are selected, and in the low power mode only the parallel second path is selected;
    matching the first output impedance by a bypass input impedance of the parallel second path in low power mode;
    wherein, when in the low power mode, the efficiency of power transfer is maximized irrespective of an input impedance of the first path.

11. The method of claim 10 wherein when in the high power mode, matching the first output impedances to the bypass input impedance about equally dividing the power flowing through each path.

12. The method of claim 10 wherein when in the low power mode, an input impedance of the first path is an open circuit and substantially all of the power is delivered to the bypass input impedance in the parallel second path.

13. The method of claim 12 wherein the bypass input impedance can be optimized for power transfer efficiency from the first amplifier to the bypass input impedance irrespective of the input impedance of the first path.

14. The method of claim 10 wherein the high power mode is where a higher power is transferred and the low power mode is where a lower power is transferred, and wherein an input impedance of the first path is greater than the bypass input impedance in the high power mode.

15. The method of claim 10 wherein, in the low power mode, the bypass input impedance of the parallel second path about matches the output impedance of the first power amplifier.

16. The method of claim 10 further comprising the steps of:
    biasing the first power amplifier, and
    biasing a second power amplifier placed in the first path, the second power amplifier defining a second output impedance, and in response to a change in modes, changing the output impedance of the second power amplifier.

17. The method of claim 10 further comprising the step of biasing the first power amplifier, wherein a bias circuit, in response to a change in modes, changes a DC bias current of the first power amplifier.

* * * * *